(12) United States Patent
Homma et al.

(10) Patent No.: US 9,881,876 B2
(45) Date of Patent: Jan. 30, 2018

(54) SEMICONDUCTOR DEVICE HAVING CONDUCTIVE SHIELD LAYER

(71) Applicant: Toshiba Memory Corporation, Tokyo (JP)

(72) Inventors: Soichi Homma, Yokkaichi Mie (JP); Yuusuke Takano, Yokkaichi Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/223,842

(22) Filed: Jul. 29, 2016

(65) Prior Publication Data

US 2017/0033086 A1 Feb. 2, 2017

(30) Foreign Application Priority Data

Jul. 31, 2015 (JP) .................... 2015-152646

(51) Int. Cl.
*H01L 23/552* (2006.01)
*H01L 25/065* (2006.01)
(Continued)

(52) U.S. Cl.
CPC ........ *H01L 23/552* (2013.01); *H01L 23/3107* (2013.01); *H01L 23/3121* (2013.01);
(Continued)

(58) Field of Classification Search
CPC ............. H01L 25/0657; H01L 23/3128; H01L 23/49827; H01L 25/50; H01L 23/49816;
(Continued)

(56) References Cited

U.S. PATENT DOCUMENTS

2005/0184378 A1* 8/2005 Sasaki ................. H01L 23/16
257/686
2011/0075014 A1* 3/2011 Hung .................. B32B 15/015
348/340
(Continued)

FOREIGN PATENT DOCUMENTS

CN 104716053 6/2015

OTHER PUBLICATIONS

Taiwanese Office Action dated Apr. 26, 2017, filed in Taiwanese counterpart Patent Application No. 105106350, 7 pages (with English translation).

*Primary Examiner* — Shouxiang Hu
(74) *Attorney, Agent, or Firm* — Patterson & Sheridan, LLP

(57) ABSTRACT

A semiconductor device includes a wiring substrate that includes a base having a first surface, a second surface, and a wiring, a semiconductor chip located on the first surface, an external connection terminal located on the second surface and electrically connected to the wiring, a sealing resin layer covering the semiconductor chip, a metal compound layer containing a metal nitride in contact with a surface of the sealing resin layer, and a conductive shield layer covering the sealing resin layer with the metal compound layer interposed between the conductive shield layer and the sealing resin layer. The wiring is exposed at a side surface of the wiring substrate, and is electrically connected to the conductive shield layer.

18 Claims, 5 Drawing Sheets

(51) Int. Cl.
H01L 23/31 (2006.01)
H01L 23/498 (2006.01)
H01L 25/00 (2006.01)
H01L 23/00 (2006.01)

(52) U.S. Cl.
CPC .... *H01L 23/3128* (2013.01); *H01L 23/49805* (2013.01); *H01L 23/49827* (2013.01); *H01L 24/97* (2013.01); *H01L 25/0657* (2013.01); *H01L 25/50* (2013.01); *H01L 23/49816* (2013.01); *H01L 24/13* (2013.01); *H01L 24/16* (2013.01); *H01L 24/32* (2013.01); *H01L 24/73* (2013.01); *H01L 24/81* (2013.01); *H01L 24/92* (2013.01); *H01L 2224/13111* (2013.01); *H01L 2224/13113* (2013.01); *H01L 2224/13116* (2013.01); *H01L 2224/13118* (2013.01); *H01L 2224/13139* (2013.01); *H01L 2224/13144* (2013.01); *H01L 2224/13147* (2013.01); *H01L 2224/16227* (2013.01); *H01L 2224/16235* (2013.01); *H01L 2224/32145* (2013.01); *H01L 2224/32225* (2013.01); *H01L 2224/48145* (2013.01); *H01L 2224/73204* (2013.01); *H01L 2224/73265* (2013.01); *H01L 2224/81011* (2013.01); *H01L 2224/92125* (2013.01); *H01L 2224/97* (2013.01); *H01L 2225/0651* (2013.01); *H01L 2225/06506* (2013.01); *H01L 2225/06562* (2013.01); *H01L 2924/15311* (2013.01); *H01L 2924/15313* (2013.01); *H01L 2924/181* (2013.01); *H01L 2924/3025* (2013.01)

(58) Field of Classification Search
CPC ... H01L 2224/13118; H01L 2924/3025; H01L 24/13; H01L 24/16; H01L 24/32; H01L 24/73; H01L 24/81; H01L 24/92; H01L 23/552; H01L 24/97; H01L 23/3121; H01L 23/49805; H01L 23/3107; H01L 2924/04941
USPC .................................................. 257/659, 734
See application file for complete search history.

(56) References Cited

U.S. PATENT DOCUMENTS

| | | | |
|---|---|---|---|
| 2012/0171471 A1* | 7/2012 | Chiou | C23C 14/022 428/336 |
| 2014/0284775 A1* | 9/2014 | Nomura | H01L 23/552 257/659 |
| 2015/0070046 A1* | 3/2015 | Takano | H01L 23/552 324/762.01 |
| 2015/0171021 A1 | 6/2015 | Takano et al. | |

* cited by examiner

… (1)

SEMICONDUCTOR DEVICE HAVING CONDUCTIVE SHIELD LAYER

CROSS-REFERENCE TO RELATED APPLICATION

This application is based upon and claims the benefit of priority from Japanese Patent Application No. 2015-152646, filed Jul. 31, 2015, the entire contents of which are incorporated herein by reference.

FIELD

Embodiments described herein relate generally to a semiconductor device, and a method for manufacturing a semiconductor device.

BACKGROUND

In a semiconductor device which is used in a communication apparatus or the like, in order to suppress electromagnetic noise interference such as electromagnetic interference (EMI), a structure of covering a surface of a sealing resin layer by a conductive shield layer is used. In order to obtain a sufficient EMI shielding effect in the above structure, it is preferable that the conductive shield layer is electrically connected to a ground wiring, and an electromagnetic noise is released to the outside of the device through the ground wiring.

In order to reduce the electrical resistance between the conductive shield layer and the ground wiring, copper is used, for example, as a material of the conductive shield layer. However, the conductive shield layer such as a copper layer is likely to be peeled off from the sealing resin layer. In this manner, when adhesion between the conductive shield layer and the sealing resin layer is low, reliability of the semiconductor device may be degraded.

DETAILED DESCRIPTION

Figure 1:
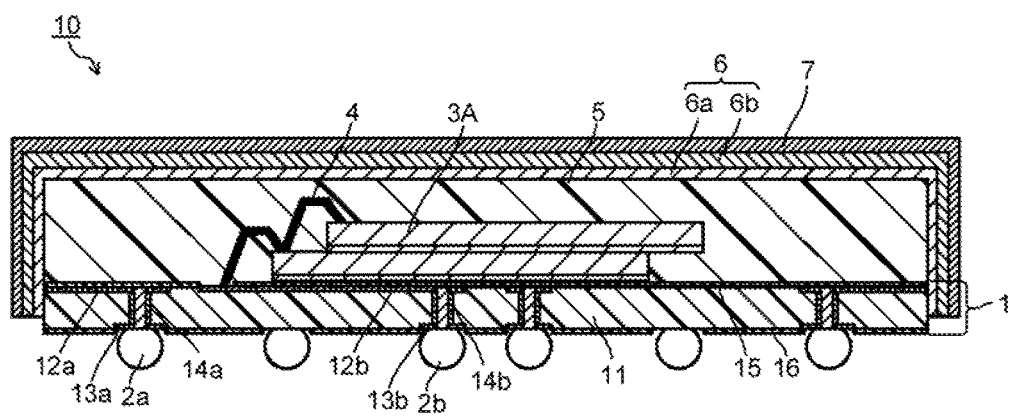
FIG. 1 is a schematic sectional view illustrating a structure example of a semiconductor device.

According to embodiments, adhesion between a conductive shield layer and a sealing resin layer is enhanced.

According to one embodiment, a semiconductor device includes a wiring substrate that includes a base having a first surface, a second surface, and a wiring, a semiconductor chip located on the first surface, an external connection terminal located on the second surface and electrically connected to the wiring, a sealing resin layer covering the semiconductor chip, a metal compound layer containing a metal nitride in contact with a surface of the sealing resin layer, and a conductive shield layer covering the sealing resin layer with the metal compound layer interposed between the conductive shield layer and the sealing resin layer. The ground wiring is exposed at a side surface of the wiring substrate, capable of set at ground potential, and electrically connected to the conductive shield layer.

Hereinafter, embodiments will be described with reference to the drawings. A relationship between a thickness and a planar dimension of each component written in the drawings, or a thickness ratio of each component may be different from an actual value. In the embodiments, the same signs are attached to the components which are substantially the same, and the description thereof will be appropriately omitted.

Figure 2:
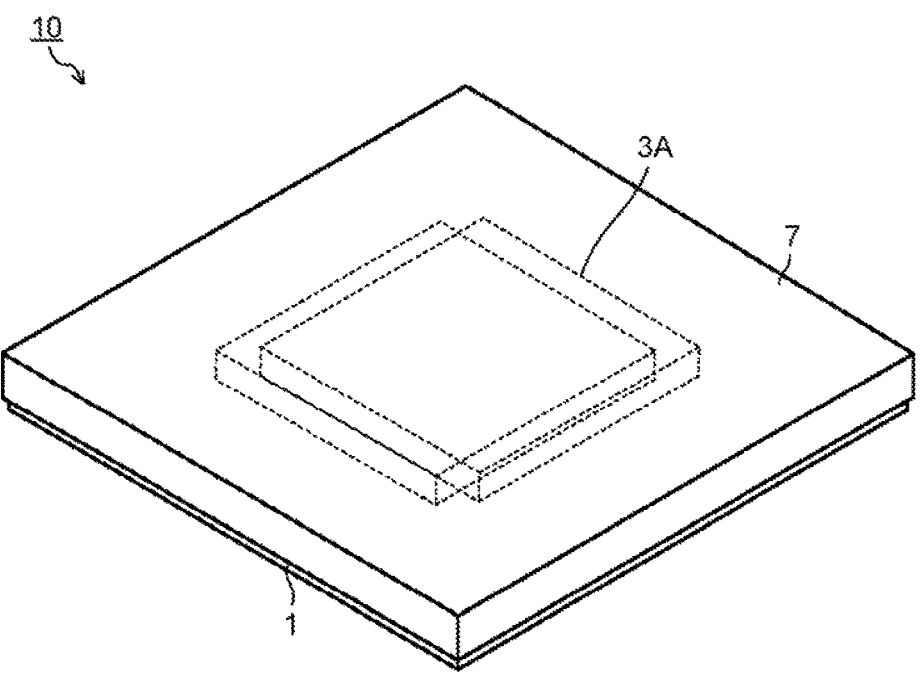
FIG. 2 is a schematic perspective view illustrating a structure example of the semiconductor device.

FIG. 1 is a schematic sectional view illustrating a structure example of a semiconductor device. FIG. 2 is a schematic perspective view illustrating a structure example of the semiconductor device. A semiconductor device 10 includes a wiring substrate 1, external connection terminals 2a and 2b, a semiconductor chip 3A, a bonding wire 4, a sealing resin layer 5, a metal compound layer 6, and a conductive shield layer 7.

The wiring substrate 1 includes an insulating base 11 having a first surface and a second surface, a conductive layer 12a arranged on the first surface, a conductive layer 12b arranged on the first surface, a conductive layer 13a arranged on the second surface, and which is electrically connected to the conductive layer 12a through a via hole 14a extending through the insulating base 11, a conductive layer 13b arranged on the second surface, and which is electrically connected to the conductive layer 12b through a via hole 14b extending through the insulating base 11, an insulating layer 15 such as a solder resist including an opening which exposes a portion of the conductive layer 12a, and an insulating layer 16 such as a solder resist including an opening which exposes a portion of the conductive layer 13a and a portion of the conductive layer 13b. The wiring substrate 1 may include a conductive layer that is superimposed on the mounting location of at least a portion of the semiconductor chip 3A. The conductive layer that is superimposed on the mounting location of at least a portion of the semiconductor chip 3A is electrically connected to the via hole 14a, and is electrically separated from the via hole 14b. By arranging the above conductive layer, it is possible to suppress a leakage of extraneous electromagnetic noise through the wiring substrate 1.

As an insulating base 11 of the wiring substrate 1, for example, a silicon substrate, a glass substrate, a ceramic substrate, or a resin substrate such as glass epoxy may be used. In at least one of the conductive layer 12a, the conductive layer 12b, the conductive layer 13a, and the conductive layer 13b, for example, a metal film using copper or silver as a main component, or a conductive paste containing copper or silver may be used, and nickel plating or gold plating may be performed onto the surface thereof as necessary. For example, the via hole 14a, and the via hole 14b include a conductor layer that is arranged on an inner surface of an opening passing through the insulating base 11, and a hole filling material with which an open interior of the surrounding conductor layer is filled. For the conductor layer, for example, a conductive paste containing copper or silver may be used, and nickel plating or gold plating may be performed on the surface thereof as necessary. For example, the hole filling material is formed of an insulating material or a conductive material. The conductor layer is not limited thereto, and for example, by coating an inner wall of a through hole by plating with a metal material (such as copper), the via hole 14a and the via hole 14b may be formed.

The external connection terminal 2a is arranged on the conductive layer 13a, and is electrically connected to the conductive layer 13a. The external connection terminal 2a functions as a ground terminal. The conductive layer 12a, the conductive layer 13a, and the via hole 14a function as a ground wiring. The external connection terminal 2b is arranged on the conductive layer 13b, and is electrically connected to the conductive layer 13b. The external connection terminal 2b functions as a signal terminal or a power supply terminal. The conductive layer 12b, the conductive layer 13b, and the via hole 14b function as a signal wiring or a power supply wiring. For example, the external connection terminal 2a and the external connection terminal 2b include solder balls. The external connection terminal 2a and the external connection terminal 2b are not limited thereto, and may include conductive lands instead of solder balls.

The semiconductor chip 3A is mounted on the first surface by an organic bonding layer such as a die attach film. The semiconductor chip 3A includes an electrode, and the semiconductor chips 3A are stacked in a multilayer manner so as to leave the electrodes exposed. The semiconductor chips 3A which are stacked in the multilayer manner are bonded to each other in sequence using the organic bonding layer such as the die attach film. The electrodes of the semiconductor chips 3A which are stacked in the multilayer manner are electrically connected to the wiring substrate 1 by the bonding wire 4. The semiconductor chip 3A is electrically connected to the conductive layer 12a by the bonding wire 4. As a bonding wire 4, for example, a gold wire, a silver wire or a copper wire is used. The surface of the copper wire may be covered with a palladium film.

The sealing resin layer 5 is arranged so as to seal the semiconductor chip 3A. The sealing resin layer 5 contains an inorganic filler such as $SiO_2$. For example, the inorganic filler may contain an aluminum hydroxide, a calcium carbonate, an aluminum oxide, a boron nitride, a titanium oxide, or a barium titanate, in addition to $SiO_2$. Moreover, for example, the inorganic filler has a particle-shape, and has a function for adjusting viscosity or hardness of the sealing resin layer 5. For example, a content of the inorganic filler within the sealing resin layer 5 is in a range of from 60% to 90% of the layer. As a sealing resin layer 5, for example, a mixture of an inorganic filler and an insulating organic resin material may be used. As an organic resin material, for example, epoxy resin is used. Furthermore, the inorganic filler may be exposed at the surface of the sealing resin layer 5.

The metal compound layer 6 is arranged to be in contact with the surface of the sealing resin layer 5. In FIG. 1, the metal compound layer 6 includes a metal compound portion 6a which contains a metal carbide in contact with the surface of the sealing resin layer 5, and a metal compound portion 6b which contains a metal nitride that is arranged on the metal compound portion 6a. The metal compound portion 6b is arranged between the metal compound portion 6a and the conductive shield layer 7. When the inorganic filler is exposed on the surface of the sealing resin layer 5, the metal compound layer 6 is in contact with the exposed inorganic filler thereon. Thereby, it is possible to enhance adhesion between the sealing resin layer 5 and the conductive shield layer 7. The metal compound layer 6 is not necessarily a continuous film. For example, a plurality of metal compound portions which are spaced from each other may be assumed as a metal compound layer 6.

For example, a thickness of the metal compound portion 6a is preferably in a range of from 0.1 nm to 100 nm. When the thickness is less than 0.1 nm, the adhesion between the sealing resin layer 5 and the conductive shield layer 7 may be deteriorated. When the thickness exceeds 100 nm, the electric sheet resistance of the metal compound portion 6a may be high, and the shielding effect may be deteriorated. For example, a thickness of the metal compound portion 6b is preferably in a range of from 0.1 nm to 100 nm. When the thickness is less than 0.1 nm, the adhesion between the sealing resin layer 5 and the conductive shield layer 7 may be deteriorated. When the thickness exceeds 100 nm, the electric sheet resistance of the metal compound portion 6b may be high, and the shielding effect thereof may be deteriorated.

As a metal carbide, for example, a nickel carbide, a titanium carbide, an iron carbide, a chromium carbide, a copper carbide, a tantalum carbide, an aluminum carbide, or a stainless steel (such as SUS304 or SUS316) carbide is used. As a metal nitride, for example, a nickel nitride, a titanium nitride, an iron nitride, a chromium nitride, a copper nitride, a tantalum nitride, an aluminum nitride, or a stainless steel (such as SUS304 or SUS316) nitride is used. Furthermore, the metal compound layer 6 may not necessarily contain the metal carbide.

The metal compound layer 6 covers at least a portion of a side surface of the wiring substrate 1. The side surface of at least a portion of the ground wiring, for example, the side surface of at least one conductive layer of the conductive layer 12a and the conductive layer 13a is exposed on the side surface of the wiring substrate 1, and the side surface of at least one conductive layer thereof may be in contact with the metal compound layer 6. Thereby, it is possible to release the extraneous electromagnetic noise from the device through the external connection terminal 2a. A plurality of contact portions may be provided among at least one conductive layer thereof and the metal compound layer 6.

The conductive shield layer 7 is located to cover the sealing resin layer 5 with the metal compound layer 6 located between the conductive shield layer 7 and the sealing resin layer 5. For example, it is preferable that the conductive shield layer 7 contain metal such as copper, nickel, titanium, gold, silver, palladium, platinum, iron, aluminum, tin or chromium, an alloy of the above metals, stainless steel, or an indium tin oxide (ITO). The conductive shield layer 7 may include a composite layer or a stacked layer of the above materials.

The thickness of the conductive shield layer 7 is preferably based on the electric resistivity thereof. For example, the thickness of the conductive shield layer 7 is preferably set so that the sheet resistance value thereof, which is obtained by dividing the electric resistivity of the conductive shield layer 7 by the thickness thereof, is 0.5Ω or less. By setting the sheet resistance value of the conductive shield layer 7 as 0.5Ω or less, it is possible to reproducibly suppress the leakage of the extraneous electromagnetic noise from the sealing resin layer 5. For example, the thickness of the conductive shield layer 7 is preferably in a range of from 0.1 μm to 20 μm. When the thickness is less than 0.1 μm, the shielding effect may be deteriorated. When the thickness exceeds 20 µm, stress of the conductive shield layer 7 may be large, and the conductive shield layer 7 may be peeled off.

The conductive shield layer 7 has a function of blocking extraneous electromagnetic noise which are emitted from the semiconductor chip 3A or the like, and suppressing the leakage thereof to the outside. The metal compound layer 6 may be assumed to be a portion of the conductive shield layer.

The conductive shield layer 7 may cover at least a portion of the side surface of the wiring substrate 1. At this location the conductive shield 7 is electrically connected to at least a portion of the ground wiring, for example, at least one conductive layer of the conductive layer 12a and of the conductive layer 13a. For example, the side surface of the at least one conductive layer of the conductive layer 12a and the conductive layer 13a is exposed on the side surface of the wiring substrate 1, and the conductive shield layer 7 may be in contact with the side surface of at least one conductive layer thereof. It is possible to release the extraneous electromagnetic noise to the outside when the external connection terminal 2a is connected to the conductive shield layer through at least one conductive layer 12a, 13a. A plurality of contact portions between at least one conductive layer thereof and the conductive shield layer 7 may be arranged. The via hole 14a may be exposed on the side surface of the wiring substrate 1, and may include a cutting surface which is in contact with the conductive shield layer 7. By arranging the cutting surface, since it is possible to increase an contact area between the via hole 14a and the conductive shield layer 7, it is possible to reduce the connection resistance.

In the semiconductor device 10, the electromagnetic noise from a thickness direction is greater than the electromagnetic noise in the direction of the plane of the substrate. Therefore, in the conductive shield layer 7, it is preferable that the portion thereof on the upper surface of the sealing resin layer 5 be greater than on the side surface of the sealing resin layer 5.

The semiconductor device according to the embodiment includes the metal compound layer containing the metal carbide and the metal nitride located between the sealing resin layer and the conductive shield layer. It is possible to enhance the adhesion between the sealing resin layer and the conductive shield layer by using the metal compound layer. Metal atoms or nitrogen atoms within the metal nitride are combined with the inorganic filler or the resin within the sealing resin layer.

Figure 3:
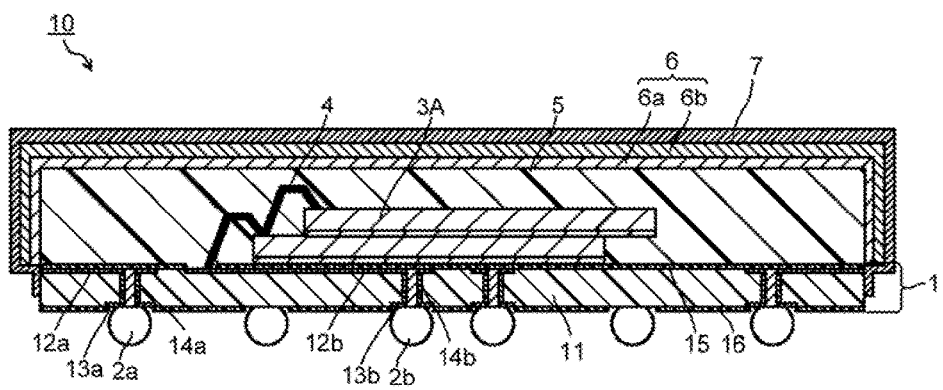
FIG. 3 is a schematic sectional view illustrating another structure example of the semiconductor device.

The semiconductor device according to the embodiment is not limited to the structure illustrated in FIG. 1. FIG. 3 is a schematic sectional view illustrating another structure example of the semiconductor device. The semiconductor device 10 illustrated in FIG. 3 is different from the structure of the first embodiment in that the metal compound layer 6 does not extend on the side surface of the wiring substrate 1, and the conductive shield layer 7 is in contact at the side surface with at least one conductive layer of the conductive layer 12a and the conductive layer 13a. Thereby, it is possible to release the extraneous electromagnetic noise to the exterior of the device through the external connection terminal 2a. A plurality of contact portions may be provided between at least one conductive layer and the conductive shield layer 7. The conductive shield layer 7 extends to the second surface of the base 11.

Figure 4:
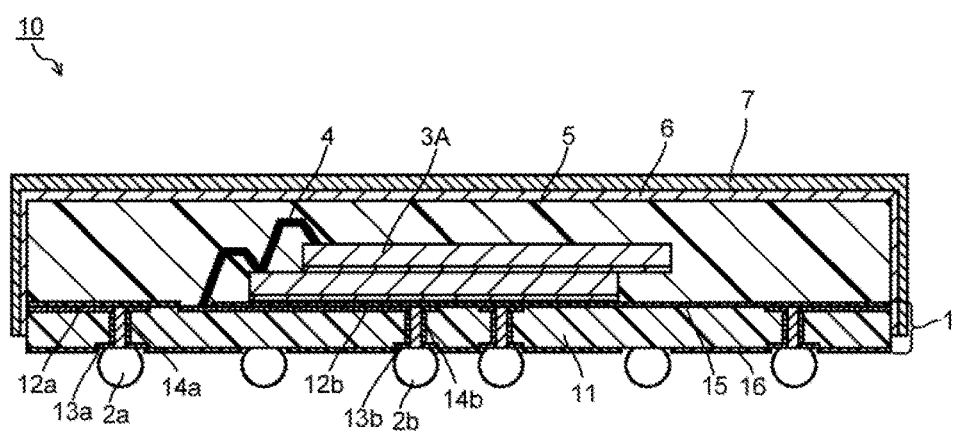
FIG. 4 is a schematic sectional view illustrating another structure example of the semiconductor device.

FIG. 4 is a schematic sectional view illustrating another structure example of the semiconductor device. The semiconductor device 10 illustrated in FIG. 4 is differs from the structure of the semiconductor device 10 of FIG. 1 in that the metal compound layer 6 is formed by a mixed layer containing both the metal carbide and the metal nitride. The thickness of the metal compound layer 6 is preferably in a range of from 0.1 nm to 100 nm. When the thickness of the metal compound layer 6 is less than 0.1 nm, the adhesion between the sealing resin layer 5 and the conductive shield layer 7 may be deteriorated. When the thickness of the metal compound layer 6 exceeds 100 nm, the electric sheet resistance of the metal compound layer 6 may be high, and the shielding effect may be deteriorated.

Figure 5:
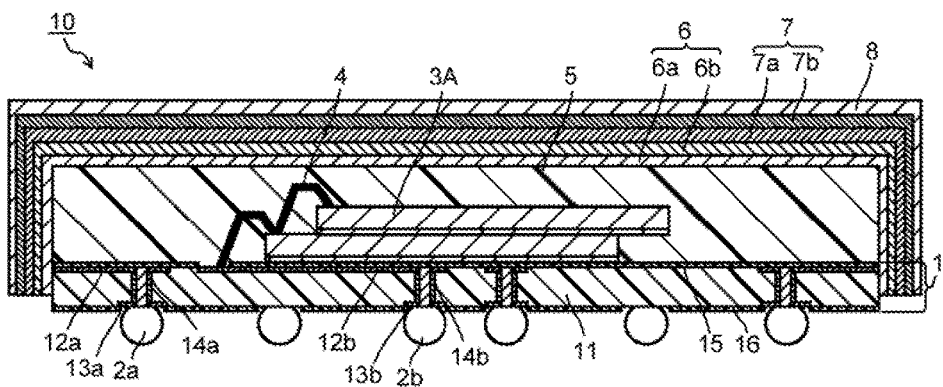
FIG. 5 is a schematic sectional view illustrating another structure example of the semiconductor device.

FIG. 5 is a schematic sectional view illustrating another structure example of the semiconductor device. The semiconductor device 10 illustrated in FIG. 5 is differs from the structure of the semiconductor device 10 illustrated in FIG. 1 in that it includes a conductive shield layer 7 that includes a metal layer 7a and a metal layer 7b, and a protective layer 8 that is arranged on the conductive shield layer 7. The structure of the semiconductor device 10 is not limited to that shown in FIG. 5, and may include the protective layer 8 that is arranged on the metal layer 7a without providing the metal layer 7b.

The metal layer 7a functions as a buffer layer (ground layer). For example, the metal layer 7a contains metal such as titanium, chromium, nickel, molybdenum, tantalum or iron, an alloy of the above metals, stainless steel, or ITO. The metal layer 7a may include a composite layer or a stacked layer of the above materials. The adhesion between the metal layer 7a and the metal compound layer 6 is preferably higher than the adhesion between the metal layer 7b and the metal compound layer 6. For example, the thickness of the metal layer 7a is preferably in a range of from 0.01 µm to 20 µm. When the thickness is less than 0.01 µm, the adhesion between the sealing resin layer 5 and the conductive shield layer 7 is deteriorated. When the thickness exceeds 20 µm, the stress of the metal layer 7a may be large, and the metal layer 7a may be peeled off.

The electric sheet resistance of the metal layer 7b is preferably lower than the electric sheet resistance of the metal layer 7a. For example, the metal layer 7b contains metal such as copper, silver, gold, palladium, or platinum. For example, the thickness of the metal layer 7b is preferably in a range of from 0.1 µm to 20 µm. When the thickness of the metal layer 7a is less than 0.1 µm, the shielding effect may be deteriorated. When the thickness of the metal layer 7a exceeds 20 µm, the stress of the metal layer 7b may be large, and the metal layer 7b may be peeled off.

The protective layer 8 is excellent in corrosion resistance or electrochemical migration resistance, and has the function of suppressing the corrosion of the conductive shield layer 7 by improving moisture resistance of the conductive shield layer 7. As a protective layer 8, for example, a metal material, a resin material, or a ceramic material is used. For example, the protective layer 8 contains metal such as titanium, chromium, nickel, iron, aluminum, molybdenum, tantalum, manganese, lanthanum or copper, stainless steel, an oxide of the above metal, a nitride of the above metal, ITO, carbon, graphite, diamond-like carbon, ZrB, MoS, TiON, TiAlN, epoxy resin, polyimide resin, acrylic resin, silicone resin, or polyamide resin. For example, the thickness of the protective layer 8 is preferably in a range from of 0.01 µm to 20 µm. When the thickness is less than 0.01 µm, an effect of suppressing the corrosion of the conductive shield layer 7 may be deteriorated. When the thickness exceeds 20 µm, the stress of the protective layer 8 may be large, and the metal layer 7b may be peeled off and cost is also increased.

Figure 6:
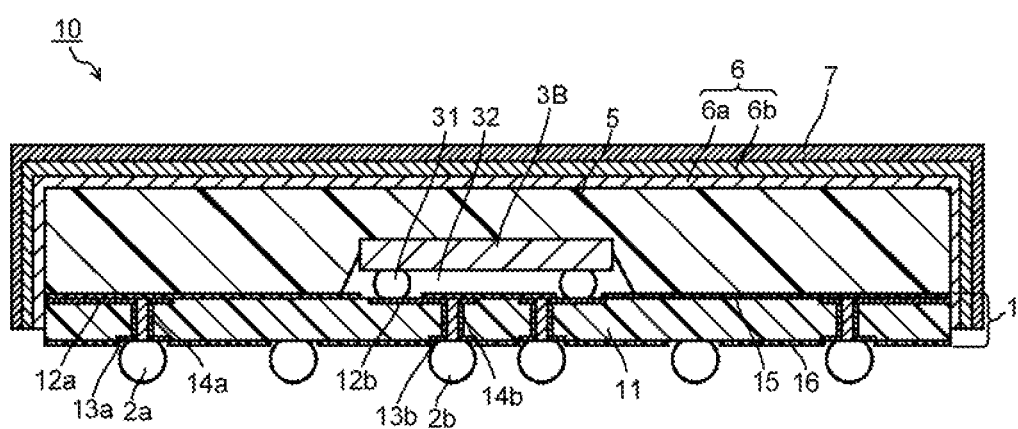
FIG. 6 is a schematic sectional view illustrating another structure example of the semiconductor device.

FIG. 6 is a schematic sectional view illustrating another structure example of the semiconductor device. The semiconductor device 10 illustrated in FIG. 6 differs from the structure of the semiconductor device 10 illustrated in FIG. 1 by including a semiconductor chip 3B instead of the semiconductor chip 3A, and not including the bonding wire 4. The semiconductor chip 3B includes a bump 31 that is electrically connected to the conductive layer 12b. For example, the bump 31 contains at least one metal of gold, tin, lead, silver, copper, bismuth, and zinc, or an alloy of the above metals. The bump 31 may be a composite layer, or a stacked layer.

The substrate on which the bump 31 is formed is singulated by dicing of a substrate on which it was formed. Thereby, the semiconductor chip 3B is formed. The semiconductor chip 3B is mounted on the wiring substrate 1 by flip chip mounting. At this time, flux coating, pretreatment, or the like may be performed. When the flux is used, the wiring substrate 1 is cleaned with a solvent or pure water. Moreover, the semiconductor device 10 illustrated in FIG. 6 includes a resin layer 32 such asunder-fill resin between the wiring substrate 1 and the semiconductor chip 3B. The semiconductor chip 3B is stacked onto the base 11 with the bumps 31 therebetween. A semiconductor chip 3B including through electrodes may also be stacked with interposing the bump therebetween.

In the semiconductor devices 10 illustrated in FIG. 1, FIG. 3 to FIG. 6, it is possible to reduce an amount of the electromagnetic noise in comparison with the semiconductor device in which the conductive shield layer 7 is not provided. Moreover, in the semiconductor devices 10 illustrated in FIG. 1, FIG. 3 to FIG. 6, for example, in a heat cycle test (temperature cycling test: TCT) in a range of from −55° C. to 150° C., even after the passing of 2,000 cycles, abnormality of the conductive shield layer 7 or a connection failure of the semiconductor chips is unlikely to occur. For example, in a high temperature preservation test which is performed at 150° C. for 1,000 hours, or in a high temperature and high humidity bias test which is performed at 85° C., humidity of 85%, and bias voltage of 3.2 V for 1,000 hours, the corrosion of the conductive shield layer 7, or the connection failure of the semiconductor chip is unlikely to occur.

Figure 7:
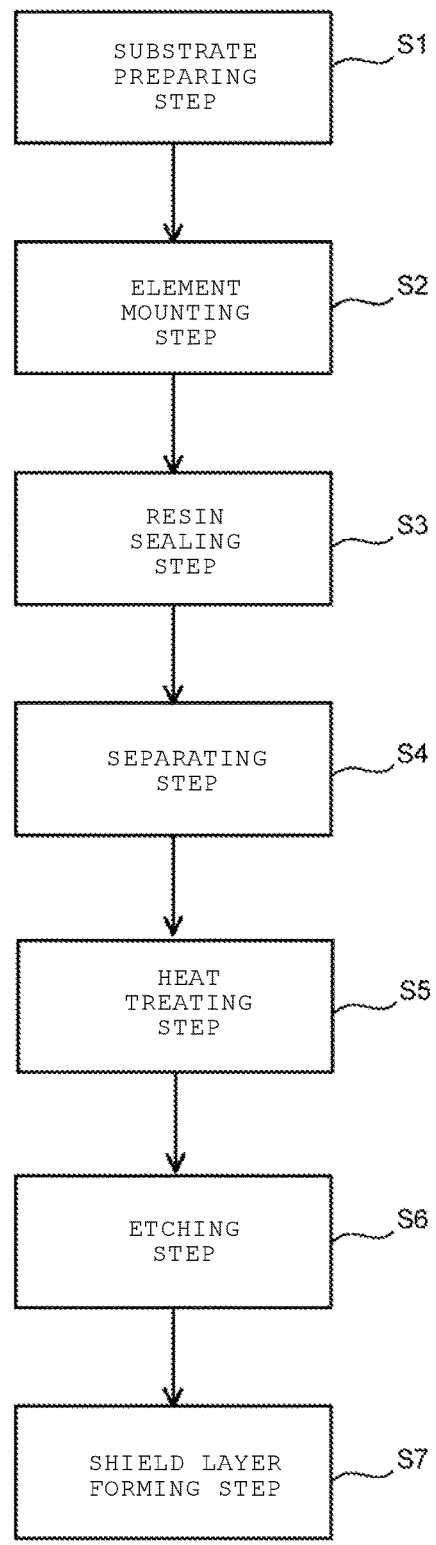
FIG. 7 is a flowchart illustrating an example of a method for manufacturing the semiconductor device.

Next, an example of a method for manufacturing the semiconductor device according to the embodiment will be described with reference to FIG. 7 to FIG. 9. FIG. 7 is a flowchart illustrating an example of a method for manufacturing the semiconductor device 10 illustrated in FIG. 1. An example of the method for manufacturing the semiconductor device illustrated in FIG. 7 includes a substrate preparation step (S1), an element mounting step (S2), a resin sealing step (S3), a separating step (S4), a heat treating step (S5), an etching step (S6), and a shield layer forming step (S7). In the embodiment, step contents and step sequences of an example of the method for manufacturing the semiconductor device are not necessarily limited to the steps illustrated in FIG. 7.

Figure 8:
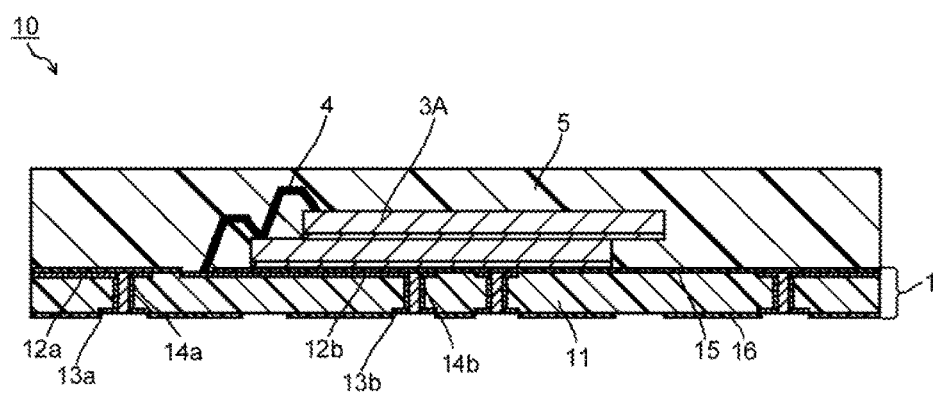
FIG. 8 is a schematic sectional view for describing an example of the method for manufacturing the semiconductor device.
Figure 9:
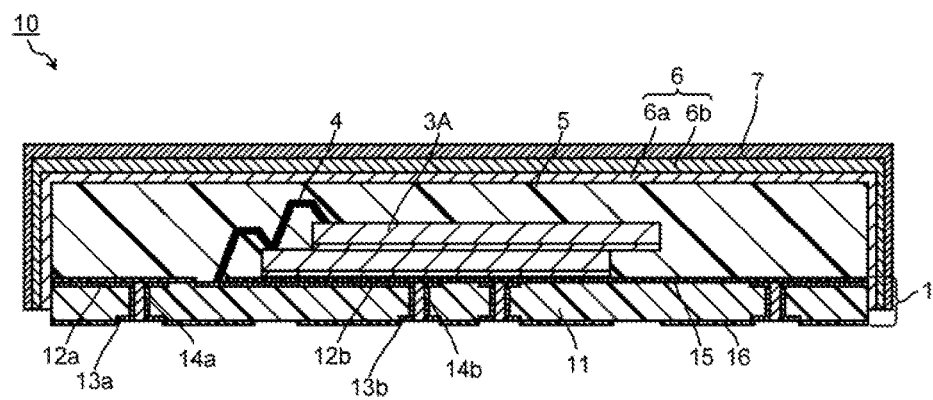
FIG. 9 is a schematic sectional view for describing an example of the method for manufacturing the semiconductor device.

FIG. 8 and FIG. 9 are schematic sectional views for describing an example of the method for manufacturing the semiconductor device 10. FIG. 8 schematically illustrates the semiconductor device after the substrate preparation step (S1) to the separation step (S4) are performed. FIG. 9 schematically illustrates the semiconductor device after the substrate preparation step (S1) to the shield layer forming step (S7) are performed.

The substrate preparation step (S1) is a step of preparing the wiring substrate 1. Here, an aggregate substrate of a structure in which a plurality of wiring substrates 1 are continuously arranged in a matrix is prepared as an example.

In the substrate preparation step (S1), the conductive layer 12a and the conductive layer 13a are formed at a location where they are cut through during dicing occurring in the separating step (S4). Moreover, a sheet-shaped die attach film or a paste die attach film is attached onto the wiring substrate 1. The die attach film may be divided as a result of dicing, laser ablation, or expansion.

The element mounting step (S2) is a step of mounting the semiconductor chip 3A on the first surface of the wiring substrate 1. In the element mounting step (S2), the semiconductor chips 3A are stacked in the multistep manner using the die attach film while exposing the electrodes of the semiconductor chip 3A. Moreover, in the element mounting step (S2), the semiconductor chips 3A, and the semiconductor chip 3A and the conductive layer 12b are electrically connected to each other by the bonding wire 4.

In the element mounting step (S2), a heat treatment may be performed after the semiconductor chip 3A is mounted on the wiring substrate 1. The wiring substrate 1 is loaded into an oven and heated to bond the semiconductor chip 3A to the wiring substrate 1, and it is possible to bond the semiconductor chips 3A to each other. Thereafter, plasma cleaning may be performed, or the electrode surface of the semiconductor chip 3A may be cleaned. For example, a plasma treatment may be performed using argon, oxygen, hydrogen, or both of argon and hydrogen. The plasma treatment may be performed after the bonding.

The resin sealing step (S3) is a step of forming the sealing resin layer 5 so as to seal the semiconductor chip 3A. As a method for forming the sealing resin layer 5, for example, a transfer mold method, a compression mold method, an injection mold method, a sheet mold method, or a resin dispense method using a mixture of the inorganic filler and the organic resin is used.

The separating step (S4) is a step of performing dicing of the substrate having the semiconductor device 10 formed thereon, and separating the substrate into individual semiconductor devices 10. For example, the dicing is performed using a blade such as a diamond blade. When the dicing is performed, the conductive layer will be exposed at the side surface of the wiring substrate 1 by cutting through the conductive layer such that the conductive layer 12a can function as a ground wiring. After the separating step (S4), for example, by a laser marking apparatus including YAG laser or the like, product information such as a product name, a product number, manufacturing year and week or a manufacturing plant may be imprinted on the upper surface of the sealing resin layer 5.

In the heat treating step (S5), the moisture which is absorbed into the semiconductor device 10 is removed by putting the individual semiconductor device into the oven, and heating the individual semiconductor device to a temperature in a range of from 100° C. to 260° C. If the temperature is less than 100° C., the adhesion between the sealing resin layer 5 and the conductive shield layer 7 is deteriorated by the presence of unremoved moisture. If the temperature exceeds 260° C., since the heating temperature is higher than the reflow temperature of solder, the semiconductor device 10 may be damaged. The process of removing the moisture may be referred to as a degas process. The heat treating process (S5) may include a plurality of heat treating processes. For example, after baking is performed in the oven, the baking may be further performed within a vacuum chamber. The baking within the vacuum chamber is performed at the temperature in the range of from 100° C. to 260° C., in the same manner as the baking in the oven.

The etching process (S6) is a process of removing a portion of the sealing resin layer 5 by dry etching. For example, the dry etching is performed in a gas atmosphere containing at least one of argon and nitrogen. Furthermore, the gas may contain at least one of oxygen and hydrogen. In the etching process (S6), for example, it is preferable that a portion of the sealing resin layer 5 be removed to a depth in a range of from 1.0 nm to 100 nm from the surface of the sealing resin layer 5. When the depth is less than 1.0 nm, the adhesion between the sealing resin layer 5 and the conductive shield layer 7 may not be sufficiently enhanced. When the depth exceeds 100 nm, since the etching time is lengthened, the process time becomes long. For example, the removed depth of the sealing resin layer 5 is controlled by adjusting etching conditions such as the etching time and a flow rate of the supplied gas. Moreover, a portion of the inorganic filler may be exposed by the etching process (S6).

A portion of the sealing resin layer 5 may be removed by reverse sputtering as the form of dry etching. In reverse sputtering, the plasma is generated by applying a voltage, and a material such as an oxide on the surface of a treated body is sputtered by ions of the gas which is supplied to the treated body bombarding the surface being dry etched.

By performing the etching, it is possible to enhance the adhesion between the sealing resin layer 5 and the conductive shield layer 7. This result is believed to occur because of an increase in a surface area of the sealing resin layer 5 or an anchoring effect due to the creation of minute roughness on the surface by exposing the inorganic filler.

The shield layer forming process (S7) is a process of forming the metal compound layer 6 so as to be in contact with the surface of the sealing resin layer 5, and forming the conductive shield layer 7 so as to cover the sealing resin layer 5. In the shield layer forming process (S7), the individual semiconductor device 10 is positioned on a tray. The tray contains metal such as aluminum, copper, iron, nickel, chromium or titanium, an alloy of the above metals, stainless steel, a composite material, or resin. Moreover, for example, a tray of a stacked structure including a resin layer and a metal layer that is located on the resin layer may be used. A resin film having sticky properties may be used instead of the tray.

In the shield layer forming process (S7), the metal compound portion 6a is formed to be in contact with the surface of the sealing resin layer 5, the metal compound portion 6b is formed on the metal compound portion 6a, and the conductive shield layer 7 is formed to cover the sealing resin layer 5 with the metal compound portion 6a and the metal compound portion 6b interposed therebetween. For example, the metal compound portion 6a, the metal compound portion 6b, and the conductive shield layer 7 are formed in sequence the sputtering. Thereby, it is possible to form the metal compound portions 6a, 6b and the shield layer 7 in a sequential treatment without exposing the treated substrate to the atmosphere outside of the sputtering chamber. The heat treating process (S5), the etching process (S6), and the shield layer forming process (S7) may also be sequentially performed in an integrated apparatus.

It is also possible to form the metal compound portion 6a, the metal compound portion 6b, and the conductive shield layer 7 using a vapor deposition method, an ion plating method, a transfer method, a screen printing method, a spray coating method, a jet dispense method, an ink jet method or an aerosol method, in addition to sputtering.

In the etching process (S6), the dry etching is performed in an atmosphere containing nitrogen by supplying nitrogen gas to a treatment chamber. Thereafter, in the shield layer forming process (S7), the conductive shield layer 7 may be formed. The dry etching may be performed in a mixed atmosphere of argon and nitrogen. Moreover, the etching atmosphere may contain at least one of oxygen and hydrogen.

When the dry etching is performed under the atmosphere containing nitrogen, the nitrogen is present on the surface of the sealing resin layer 5. When the conductive shield layer 7 is formed on the surface of the sealing resin layer 5 where the nitrogen is present, the metal that is contained in the conductive shield layer 7 reacts with the nitrogen, and a metal nitride is generated. Therefore, it is possible to form the metal compound portion 6b containing the metal nitride without separately independently forming the metal compound portion 6b. Accordingly, it is possible to simplify a manufacturing process. By the manufacturing method described above, for example, it is possible to manufacture a semiconductor device of a structure in which the metal compound layer 6 illustrated in FIG. 3 is not located on the side surface of is the wiring substrate 1, and the conductive shield layer 7 is in contact with the side surface of at least one of the conductive layer 12a and the conductive layer 13a.

After the sealing resin layer 5 is formed, carbon from resin is present on the surface of the sealing resin layer 5. When the conductive shield layer 7 is formed on the surface of the sealing resin layer 5 where the carbon is present, the metal which is contained in the conductive shield layer 7 reacts with the carbon, and a metal carbide is generated. Accordingly, it is possible to form the metal compound portion 6a containing the metal carbide without providing a process of separately forming the metal compound portion 6a. In the etching atmosphere, the carbon on the surface of the resin may be activated, and the metal compound layer 6 may be a mixed layer of the metal carbide and the metal nitride.

After the substrate preparation process (S1) to the shield layer forming process (S7) are performed, the external connection terminal 2a that is electrically connected to the conductive layer 13a is attached, and the external connection terminal 2b that is electrically connected to the conductive layer 13b is attached. The external connection terminals 2a and 2b are not limited thereto, and for example, in the element mounting process (S2), the external connection terminals 2a and 2b may be arranged. Furthermore, a process of checking whether or not the quality of the connection is good by measuring the resistance value using the external connection terminals 2a and 2b of the prepared semiconductor device may be arranged. Hitherto, the embodiment describes an example of the method for manufacturing the semiconductor device.

While certain embodiments include been described, these embodiments include been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

EXAMPLES

Example 1

Semiconductor devices were prepared as Sample 1 to Sample 3 using different etching conditions for each sample during the etching process (S6). The etching conditions for each sample are illustrated in Table 1. In preparing Sample 1, the conductive shield layer was formed after the etching was performed using both of Ar gas and N₂ gas. In preparing Sample 2, the conductive shield layer was formed after the etching was performed by using only Ar gas. In preparing Sample 3, the conductive shield layer was formed without performing the etching. In Sample 1 to Sample 3, the conductive shield layer has a stacked structure of a stainless steel (SUS) layer and a copper (Cu) layer which is arranged on the stainless steel layer. The thickness of the stainless steel (SUS) layer is 0.1 µm. The thickness of the copper (Cu) layer (Cu) is 3 µm. Furthermore, in preparing Sample 1 to Sample 3, a stainless steel layer having the thickness of 0.3 µm is formed on the conductive shield layer.

An adhesion test was performed by a cross-cut method with respect to the prepared samples. A ratio (peeling rate (%)) of the number of samples which are peeled off by the adhesion test are illustrated in Table 1.

TABLE 1

|  | GAS | PEELING RATE (%) |
| --- | --- | --- |
| SAMPLE 1 | Ar or N₂ | 0 |
| SAMPLE 2 | ONLY Ar | 1.5 |
| SAMPLE 3 | — | 100 |

As illustrated in Table 1, in Sample 1 for which the etching is performed using both of Ar gas and N₂ gas, the peeling rate is 0%. In Sample 2 that is prepared in which the etching is performed using only Ar gas, and Sample 3 that is prepared without performing the etching step, peeling of the conductive shield layer occurred during the peel test.

Example 2

Sample A, Sample B, and Sample C are prepared by forming the stainless steel layer of 10 nm on the resin layer including the inorganic filler. In preparing Sample A, the etching of the resin layer is performed by supplying both of Ar gas and N₂ gas. In preparing Sample B, the etching of the resin layer is performed by supplying only Ar gas. In preparing Sample C, the etching of the resin layer is not performed. The Ar gas flow rate, and the N₂ gas flow rate of the etching process in preparing Sample A are the same as the Ar gas flow rate, and the N₂ gas flow rate of the etching process in preparing Sample 1 of Example 1 as illustrated in Table 2. The Ar gas flow rate of the etching process in preparing Sample B is the same as the Ar gas flow rate of the etching process in preparing Sample 2 of Example 1 as illustrated in Table 2.

By performing a depth direction analysis using X-ray photoelectron spectroscopy (XPS) with respect to the prepared samples, presence or absence of the metal carbide, and presence or absence of the metal nitride between the resin layer and the stainless steel layer are confirmed. Results thereof are illustrated in Table 2.

TABLE 2

|  | GAS | METAL CARBIDE | METAL NITRIDE |
| --- | --- | --- | --- |
| SAMPLE A | Ar or N₂ | PRESENCE | PRESENCE |
| SAMPLE B | ONLY Ar | PRESENCE | ABSENCE |
| SAMPLE C | — | PRESENCE | ABSENCE |

As illustrated in Table 2, Sample A contains the metal carbide, and the metal nitride. On the contrary, neither Sample B nor Sample C contains the metal nitride. Therefore, by forming the conductive shield layer after the etching is performed using both of Ar gas and N₂ gas, it is found out that a metal compound layer containing the metal carbide and the metal nitride is formed.

By forming the metal compound layer containing the metal nitride from Example 1 and Example 2, it is found out that it is possible to enhance the adhesion between the sealing resin layer and the conductive shield layer.

What is claimed is:

1. A semiconductor device comprising:
   a wiring substrate comprising a base having a first surface, a second surface, and a side surface, and a wiring;
   a semiconductor chip located on the first surface;
   an external connection terminal located on the second surface and electrically connected to the wiring;
   a sealing resin layer covering the semiconductor chip;
   a metal compound layer comprising a metal nitride portion and a metal carbide portion, the metal carbide portion being in contact with a surface of the sealing resin layer, the metal carbide portion being in contact with the metal nitride; and
   a conductive shield layer covering the sealing resin layer, wherein the metal compound layer is interposed between the conductive shield layer and the sealing resin layer, the conductive shield layer being in contact with the metal nitride portion,
   wherein the wiring is exposed at the side surface of the wiring substrate, and is electrically connected to the conductive shield layer.

2. The device according to claim 1, further comprising:
   a protective layer located on the conductive shield layer, wherein the conductive shield layer comprises:
      a first metal layer covering the sealing resin layer with the metal compound layer interposed between the first metal layer and the sealing resin layer, and
      a second metal layer located on the first metal layer, an electrical resistance thereof being lower than an electrical resistance of the first metal layer.

3. The device according to claim 1, wherein the wiring is electrically connected to the conductive shield layer through the metal compound layer.

4. The device according to claim 1, wherein the wiring is capable of being set at ground potential.

5. The device according to claim 1, wherein the substrate further comprises a signal wiring and a power wiring disposed on the first surface thereof.

6. The device according to claim 5, wherein the signal wiring and the power wiring are electrically connected to conductive vias extending through the substrate from the first surface thereof to the second surface thereof.

7. The device according to claim 1, wherein the metal nitride portion is in direct contact with the conductive shield layer.

8. The device according to claim 1, wherein the sealing layer has a top surface and a side surface, and the metal compound layer covers the top surface of the sealing resin layer and the side surface of the sealing resin layer.

9. The device according to claim 1, wherein the metal nitride portion includes at least one of nickel, iron, chromium, copper, tantalum, and aluminum.

10. The device according to claim 1, wherein the metal nitride portion includes at least one of nickel, iron, and chromium.

11. The device according to claim 1, wherein the metal carbide portion includes at least one of nickel, copper, tantalum, and aluminum.

12. The device according to claim 1, wherein the metal carbide portion includes nickel.

13. The device according to claim 9, wherein the metal carbide portion includes at least one of nickel, copper, tantalum, and aluminum.

14. The device according to claim 9, wherein the metal carbide portion includes nickel.

15. The device according to claim 10, wherein the metal carbide portion includes at least one of nickel, copper, tantalum, and aluminum.

16. The device according to claim 10, wherein the metal carbide portion includes nickel.

17. The device according to claim 1, wherein a thickness of the metal carbide portion is in range of from 0.1 nm to 100 nm.

18. The device according to claim 1, wherein a thickness of the metal nitride portion is in range of from 0.1 nm to 100 nm.

\* \* \* \* \*